United States Patent [19]

Itoh

[11] Patent Number: 4,805,555

[45] Date of Patent: Feb. 21, 1989

[54] APPARATUS FOR FORMING A THIN FILM

[75] Inventor: Hiroki Itoh, Amagasaki, Japan

[73] Assignee: Mitsubishi Denki Kabushiki Kaisha, Japan

[21] Appl. No.: 113,165

[22] Filed: Oct. 27, 1987

[30] Foreign Application Priority Data

Oct. 29, 1986 [JP] Japan ............................ 61-255848
Mar. 13, 1987 [JP] Japan ............................ 62-56686
May 8, 1987 [JP] Japan ............................ 62-110613

[51] Int. Cl.⁴ .......................................... C23C 16/00
[52] U.S. Cl. ................................. 118/719; 118/50.1; 118/723
[58] Field of Search .................. 118/719, 723, 50.1

Primary Examiner—Bernard Pianalto
Attorney, Agent, or Firm—Leydig, Voit & Mayer

[57] ABSTRACT

When reactive gases are directed toward a substrate disposed in a vacuum atmosphere, the reactive gases are activated by irradiation with an electron beams. The reactive gases react with vapor or cluster ions of a material to be deposited, thereby forming a thin film of the reaction products. Therefore, a thin film with high quality can be efficiently deposited on a substrate.

14 Claims, 2 Drawing Sheets

APPARATUS FOR FORMING A THIN FILM

BACKGROUND OF THE INVENTION

This invention relates to a method for forming a thin film and an apparatus thereof, and more particularly to a method for forming a compound thin film and an apparatus thereof in which the compound thin film is deposited on a substrate by means of reactive ionized cluster beam method (R-ICB method).

Conventionally, a compound thin film such as TiN, $Al_2O_3$, or SiC, is deposited on the surface of a substrate by sputtering, chemical vapor deposition (CVD) or the like. Even using these methods, however, there were problems in that the thin film deposited on the surface of the substrate had insufficient hardness and low adhesive strength with the substrate. For solving these problems, the reactive-ionized cluster beam (R-ICB) method was developed, in which the thin film is formed by emitting the vapor of a material to be deposited into a reactive gas atmosphere.

FIG. 1 is a schematic view showing an R-ICB apparatus which is disclosed, for example, in Japanese Patent Publication No. 57-54930 or Proceedings of the International Ion Engineering Congress (ISIAT '83 and IPAT '83). In FIG. 1, an evacuation system 5 evacuates gases in a vacuum chamber 6 and maintains the pressure in the chamber 6 at a predetermined value. A reactive gas introduction system for introducing reactive gases into the chamber 6 comprises a gas cylinder 41 for charging reactive gases such as oxygen, nitrogen and hydrocarbons into the chamber 6, a flow regulation valve 42 for regulating the flow rate of the reactive gases which are supplied from the gas cylinder 41 to the chamber 6, and a gas introduction pipe 43 for introducing the reactive gases to a predetermined portion in the chamber 6. A vapor generating means 1 for generating a vapor of a material to be deposited is provided which comprises a closed type crucible 12 having a nozzle 11, in which a material 15 to be deposited is packed, a coiled filament 13 disposed around the crucible 12 for heating the crucible 12 to evaporate the material 15 therein, and a heat shielding plate 14 for shielding the heat of the filament 13. Vapor of the material 15 is emitted through the nozzle 11 of the crucible 12 to form clusters 16 consisting of a large number of atoms. The clusters 16 formed are ionized by an ionization means 2 which comprises an electron beam emitting means such as a coiled filament 21, an electron beam extraction electrode 22 for extracting electrons from the filament 21 and accelerating them, and a heat shielding plate 23 for shutting out the heat of the filament 21. An acceleration electrode 3 disposed over the ionization means 2 accelerates the ionized clusters 16a by its electrical field, so as to impart more kinetic energy to the ionized clusters 16a. Disposed over the acceleration electrode 3 is a substrate 7 on the surface of which a compound thin layer 71 is to be formed. An electric power unit 8 for the vapor generating means 1 is provided on the outside of the chamber 6 and contains direct current power sources 81, 82 and 83 for applying bias voltages and power sources 84 and 85 for heating the filaments 13 and 21. Each of the bias power sources in the power unit 8 functions as follows. The first direct current power source 81 biases the potential of the crucible 12 positive in respect to the filament 13 so that thermal electrons emitted from the filament 13, heated by using the power source 84, collide with the crucible 12. The second direct current power source 82 biases the potential of the filament 21, heated by the power source 85, negative in respect to the electrode 22, thereby drawing the thermal electrons emitted from the filament 21 into the inside of the electrode 22. The third direct current power source 83 biases the potentials of the electrode 22 and the crucible 12 positive, in respect to the acceleration electrode 3 which is at ground an earth potential, so as to control the acceleration of the positive charged cluster ions by means of the electrical field lens formed between the electrode 22 and the crucible 12.

The conventional R-ICB apparatus is constructed as mentioned above operates as follows. After evacuating the chamber 6 by the evacuation system 5 to a pressure of around $1 \times 10^{-6}$ mmHg, the reactive gases are introduced into the chamber 6 through the pipe 43 by opening the valve 42. A portion of the reactive gases introduced into the chamber 6 is activated, namely excited or dissociated, at a location above and near over the vapor generating means 1. Then, this portion of the reactive gases thus partially activated reaches the surface of the substrate 7.

On the other hand, the crucible 12 is heated by a collision of the electrons emitted from the filament 13 to which direct current is applied by means of the power source 81. By the heating of the crucible 12, the material 15 in the crucible 12 is vaporized to emit the vapor therefrom through the nozzle 11 into the chamber 6. At this time, the crucible 12 is heated up to a temperature where the vapor pressure of the material 15 in the crucible 12 reaches several mmHg. When the vapor emitted from the crucible 12 passes through the small nozzle 11, the clusters 16 are formed by adiabatic expansion of the vapor due to the pressure differences between the crucible 12 and the chamber 6 under supercooling conditions. The clusters 16 are massive atomic groups formed by condensing 100 to 1000 atoms of the material 15 under the above conditions. A portion of the clusters 16 are then ionized by the electrons emitted from the filament 21 to make the cluster ions 16a. The cluster ions 16a and non-ionized clusters 16 are accelerated by the electrical field generated by the acceleration electrode 3 and drift toward the substrate 7. Therefore, the substrate 7 will be surrounded by the reactive gases introduced into the chamber 6. Then, the reaction of the cluster ions 16a and clusters 16 with the reactive gases occurs in the neighborhood of the substrate 7 to produce compounds. A thin film 71 of the compounds produced is then deposited on the substrate 7.

In the above-mentioned conventional method and apparatus for forming the thin film of compounds, the reactive gases in the chamber 6 are in a molecular state and the activity thereof is low. Moreover, since the reactive gases activated around the vapor generating means 1 have short activity spans, the activated reactive gases near the substrate 7 are apt to return to a low activity condition. Therefore, the reactivity of the compounds formed by the reaction is low, making the thin film deposited on the substrate 7 unstable. Further, most of the reactive gases are evacuated without being used to form the thin film of the compounds.

SUMMARY OF THE INVENTION

Accordingly, an object of the present invention is to provide a method and an apparatus for forming a thin film in which the thin film of high quality can be efficiently deposited on the surface of a substrate.

In order to achieve the above object, according to one aspect of the present invention, there is provided a method for forming a thin film comprising the steps of: activating reactive gases by irradiating the reactive gases with an electron beam, when the reactive gases are directed toward a substrate disposed in a vacuum atmosphere; forming clusters vapors of a material that is to be deposited on the substrate; partially ionizing the clusters and the vapors, to make cluster ions and vapor ions, respectively; directing the cluster ions, the vapor ions, and the non-ionized clusters and vapors toward the substrate which is surrounded with the activated reactive gases; and reacting these ionized and non-ionized clusters and vapors with the activated reactive gases to obtain compounds and to form a thin film of the compounds on the substrate.

According to another aspect of the present invention, there is provided an apparatus for forming a thin film comprising: a vacuum chamber maintained at a predetermined degree of vacuum; a substrate disposed in the chamber; a vapor generating means disposed in the chamber for generating vapors and clusters of a material to be deposited; an ionization means for ionizing the vapors and the clusters which are generated by the vapor generating means; a first acceleration electrode for accelerating the ionized vapors and clusters to collide with the substrate; an internal vessel disposed in the chamber; a gas injection nozzle disposed in the internal vessel for injecting reactive gases toward the substrate; an electron beam emitting means disposed around a path of the injected reactive gases; an electron beam extraction electrode for drawing electron beams out from the electron beam emitting means; and a second acceleration electrode disposed on an opening provided on a wall of the internal vessel in a direction coincident with that of the injected reactive gases for accelerating the reactive gases.

In the present invention, since vapors and clusters of a material to be deposited and reactive gases exist under very active conditions in the neighborhood of a substrate, chemical reactions or deposition reactions can be performed efficiently. Moreover, the kinetic energy of the ions can be controlled by means of the acceleration electrodes, therefore, ensuring that the thin film formed is of high quality. Further, since an electrical field shielding means shuts or confines the electron beams therewithin, the electron beams are concentrated near a path of the reactive gases, thereby allowing the efficient activation of the reactive gases.

BRIEF DESCRIPTION OF THE DRAWINGS

The present invention will be more readily apparent from the following detailed description of a preferred embodiment thereof when taken in conjunction with the accompanying drawings, in which.

DESCRIPTION OF THE PREFERRED EMBODIMENT

Figure 1:
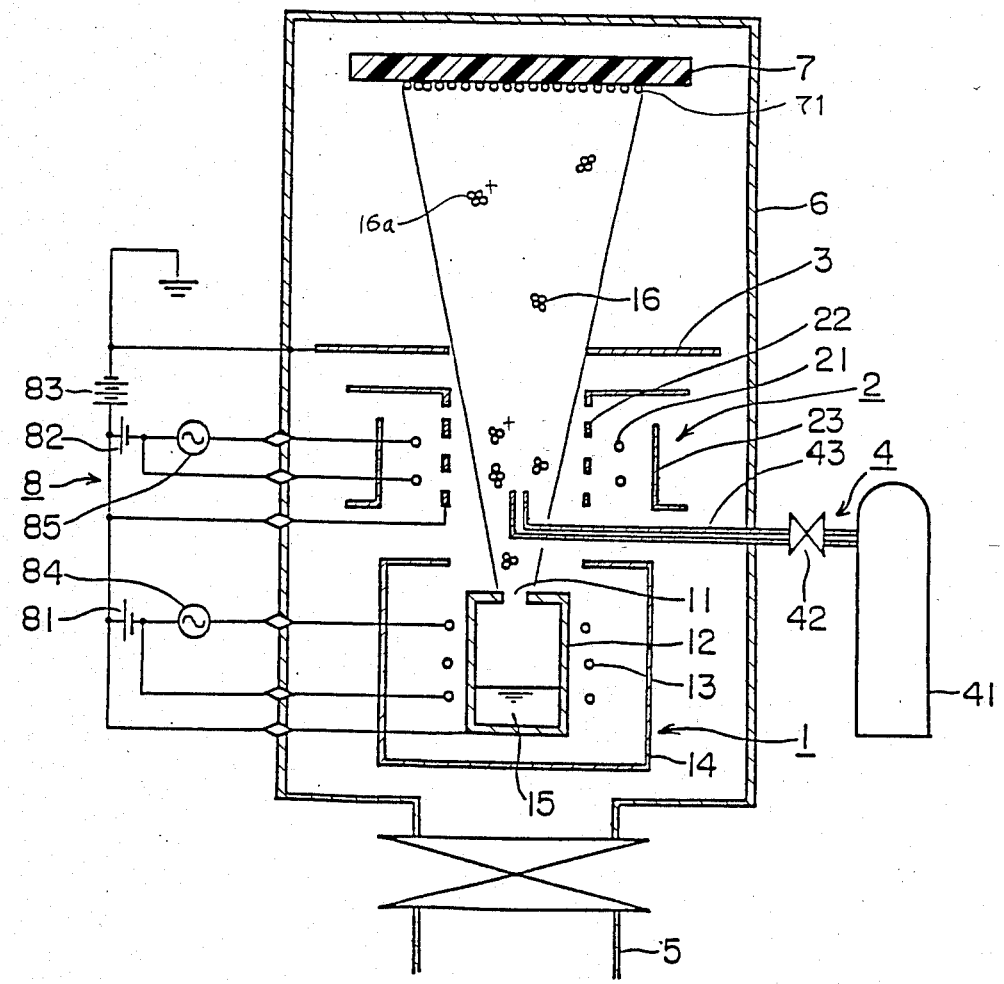
FIG. 1 is a schematic view showing a conventional R-ICB apparatus.
Figure 2:
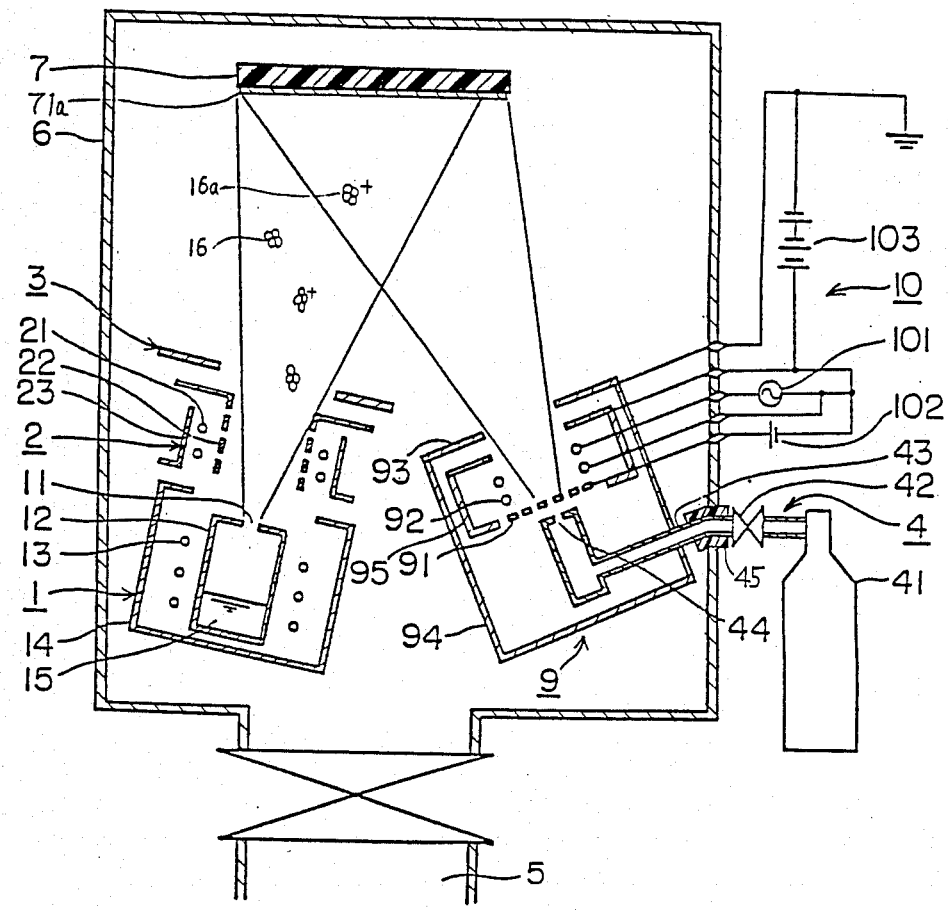
FIG. 2 is a schematic view of an apparatus for forming a thin film on a substrate according to the present invention.

The present invention will be described in detail with reference to a presently preferred embodiment thereof as illustrated in FIG. 2. In FIG. 2, the same reference numerals as in FIG. 1 indicate the same or corresponding parts.

In FIG. 2, an internal vessel 94 is disposed in a vacuum chamber 6 in a spaced opposite relation to a substrate 7. A gas ion source 9 for activating, namely exciting, dissociating or ionizing, reactive gases in the neighborhood of the substrate 7 is provided which comprises an internal vessel 94 and several members within the vessel 94 which will be described in detail later. The reactive gases may be at least one of oxygen, nitrogen and hydrogen, or may contain elements which produce compounds of a thin film to be deposited on the substrate 7. The reactive gases are introduced into the vacuum chamber 6 through a gas introduction means 4 and injected therefrom into the internal vessel 94 from a gas injection nozzle 44. The gas injection nozzle 44 is connected with the inner end of a pipe 43 which extends through and is hermetically mounted on a side wall of the chamber 6 through an insulating member 45 formed of ceramic. As electron beam emitting means 92 in the form of a filament is disposed around a path of the reactive gases which are injected from the nozzle 44. An electron beam extraction electrode 91 is also disposed in and around the path of the injected reactive gases for extracting the electron beams from the filament 92. By means of the electrode 91 and the filament 92, the reactive gases are ionized with their electron beams. A shielding means 95 in the form of a conductive plate such as a metal plate for shielding potentials of the means 92 and electrode 91 is disposed in the internal vessel 94 so as to surround the electron beam emitting means 92 and the extracting electrode 91. A second acceleration electrode 93 for accelerating the injected reactive gases is disposed on an open end of the internal vessel 94 in the injection direction of the reactive gases. The internal vessel 94 surrounds the above-mentioned members, namely, the emitting means 92, the extracting electrode 91, the second acceleration electrode 93 and the shielding means 95, and the internal vessel 94, the injection nozzle 44 and a portion of the pipe 43 disposed in the internal vessel 94. These members constitute the gas ion source 9.

An electric power unit 10 for the gas ion source 9 is provided on the outside of the chamber 6, which includes a power source 101 for heating the electron beam emitting means 92, a direct current power source 102 for biasing the electrode 91 to a positive potential in respect to the filament 92 and the electrical shielding means 95, and a direct current power source 103 for biasing the filament 92 and the electrode 91 to a positive potential in respect to the second acceleration electrode 93.

A vapor generating source 1 for generating vapors and clusters of a material to be deposited and other members, namely, an ionization means 2 for ionizing the vapors and clusters generated, and a first acceleration electrode 3 for accelerating the ionized vapors and clusters are constructed in the same manner as in FIG. 1 showing a conventional R-ICB apparatus. In the embodiment of the present invention, however, the crucible 12 has at least one nozzle 11 having a diameter of about 2 mm or more. An illustration of an electrical power unit 8 for the vapor generating means 1 is omitted in FIG. 2.

In the above-mentioned apparatus for forming a thin film according to the present invention, the pressure in the vacuum chamber 6 is adjusted to be a predetermined degree of vacuum by means of the evacuation system 5. The reactive gases, flow rate of which is regulated by a flow regulating valve 42, are introduced into the chamber 6 through a gas introduction pipe 43. Then, the reactive gases introduced are further guided into the internal vessel 94 from the gas injection nozzle 44, so as to adjust the pressure in the chamber 6 to be at about $10^{-4}$ to $10^{-3}$ mmHg. The gas pressure in the internal vessel 94 is higher than that of the chamber 6. The filament 92 as the electron beam emitting means, disposed in the electrical field shielding means 95, is heated to a temperature of about 2000° C. by means of the power source 101. The power source 102 biases the electrode 91 to a positive potential in respect to the filament 92 and the shielding means 95, thereby emitting the electron beam from the filament 92 toward the electrode 91, which is disposed downstream of the injection nozzle 44. By the application of the bias voltage due to the power source 102, electrons at a current rate of 1A (ampere) to 5A (amperes) are emitted from the filament 92 towards the reactive gases injected from the injection nozzle 44 so that the reactive gases are excited, dissociated or ionized. Since the potential of the filament 92 is identical to that of the shielding means 95, the electron beams thus emitted are confined within the shielding means 95 and are especially concentrated around the path of the reactive gases. Therefore, the reactive gases can be activated efficiently. The ionized reactive gases and the electron beams are accelerated by the second acceleration electrode 93 so as to inpinge against the substrate 7. This acceleration can be controlled by varying the voltage applied to the electrode 93. For example, 0 to 0.2 KV of acceleration voltage will cause about a $10^{-6}$ A/mm$^2$ electron beam to irradiate the substrate 7 and 0.2 KV to 0.6 KV will cause a $10^{-6}$ to $10^{-5}$ A/mm$^2$ ion beam to irradiate the substrate 7. The accelerated ion beams and the electron beams activate the reactive gases existing near the substrate 7, thereby promoting the reaction of the reactive gases with the clusters of the material to be deposited so as to efficiently form the thin film of the reaction produced compounds on the substrate 7 without accompanying dangling bonds.

In the vapor generating means 1, the crucible 12 is heated to a temperature where a vapor pressure of the material 15 to be deposited in the crucible 12 becomes several mmHg, by means of the filament 13 to which AC voltage is applied from the power source 84. In this state, the heated material 15 in the crucible 12 is evaporated, and then emitted through the nozzle 11 to form the clusters 16. A part of the emitted clusters 16 and vapors are then ionized by electrons emitted from the filament 21. The ionized vapors and the ionized clusters 16a are accelerated by an electrical field, which is generated by the first acceleration electrode 3 under the application of 0 to several KV by the power source 83, so as to impinge against the substrate 7 along with the remaining non-ionized vapors and clusters 16. During this time, it is possible to independently control the kinetic energies of the reactive gas ions and the vapor or cluster ions 16a by changing the voltages applied to the first and second acceleration electrodes 3 and 93 separately. This makes it possible to control the properties of the compounds, for example crystallinity, such as monocrystalline, polycrystalline, mixed crystallites of related compounds, or a disordered structure, such as a partially or completely amorphous compound electrical properties, and adhesion to the substrate. In the above-mentioned embodiment of the present invention, the substrate 7 may be physically cleaned, by having the reactive gases collide with the surface of substrate 7 after the activated reactive gases have reached the neighborhood of the substrate 7. Thereafter, the reaction of the reactive gases with the vapors or clusters of the material 15 is allowed to occur. By physically cleaning of the substrate, a high quality thin film can be deposited on the clean surface of the substrate.

In the above-mentioned embodiment of the present invention, the potential of the shielding means 95 is identical to that of the electron beam emitting means 92, however, the potential of the shielding means 95 may be biased to a negative potential in respect to the electron beam emitting means. This results in the concentration of the electron beams from the electron beam emitting means 92 on or near the flow path of the reactive gases.

To deposit a titanium nitride thin film, nitrogen gas, mixed gas containing nitrogen, or a gas containing elemental nitrogen is used as the reactive gas, and titanium is used as a material 15 to be deposited. The reactive gas is activated to form an activated gas region in the neighborhood of the substrate 7 in the same manner mentioned above. Then, the vapor of the titanium packed in the crucible 12 is emitted from the nozzle to partially form clusters 16 of titanium. A portion of these vapors and clusters are ionized and accelerated into the reactive gas existing around the substrate. The reactive gas reacts with the vapors and clusters depositing a titanium nitride thin film on the substrate 7. It is desirable that the deposition rate of the titanium nitride thin film be 100 Å. The reaction between titanium vapor and nitrogen gas is as follows:

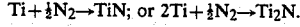

Accordingly, the titanium nitride thin film deposited on the substrate may be TiN crystals, Ti$_2$N crystals or mixed crystals of TiN and Ti$_2$N. In the deposition of the titanium nitride, carbon or tungsten are suitable as the crucible material.

In a second example, in depositing an amorphous silicon (A-Si:H) thin film, hydrogen gas is used for the reactive gas, and silicon for the material to be deposited. The reactive gas is activated to form an activated gas region in the neighborhood of the substrate. The reactive gas is then reacted with the silicon vapor to deposit an amorphous silicon (a-Si:H) thin film on the surface of the substrate, in which hydrogen gas is contained in the amorphous silicon thin film. In this case, tantalum or tungsten is suitable for the crucible material. It is desirable that the kinetic energy for accelerating the cluster ions of silicon be 0.5 KeV or more.

What is claimed is:

1. An apparatus for forming a thin film comprising:
   a vacuum chamber;
   reactive gas supplying means for supplying an activated reactive gas in the vicinity of a surface of a substrate disposed in said vacuum chamber;
   vapor producing means for producing vapors of a material to be deposited on said substrate;
   clusterizing means for forming clusters of said vapors;
   ionizing means for partially ionizing said vapors and said clusters; and
   means for directing said cluster ions, said vapor ions, and non-ionized clusters and vapors toward the surface of said substrate so that said cluster ions, said vapor ions, and non-ionized clusters and vapors can react with said activated reactive gas in the vicinity of the surface to form a thin film of reaction compounds on the substrate surface.

2. An apparatus for forming a thin film as claimed in claim 1 wherein said reactive gas supplying means comprises:
- an internal vessel disposed in said vacuum chamber and including an outlet opening;
- an injection nozzle disposed in said internal vessel and connected with a pressurized gas source for injecting a pressurized gas supplied from said pressurized gas source toward the surface of said substrate through said outlet opening in said internal vessel; and
- activation means disposed in said internal vessel for activating said pressurized gas injected from said injection nozzle into a reactive state.

3. An apparatus for forming a thin film as claimed in claim 2 wherein said activation means comprises:
- electron beam emitting means disposed in said internal vessel; and
- electron beam extracting means for extracting electron beams from said electron beam emitting means and directing said beams toward said reactive gas injected from said injection nozzle to excite, dissociate, and ionize the gas.

4. A apparatus for forming a thin film as claimed in claim 3, wherein said electron beam emitting means and said electron beam extracting means are disposed near said injection nozzle.

5. An apparatus for forming a thin film as claimed in claim 3, wherein said electron beam emitting means comprises a filament disposed adjacent said injection nozzle and said electron beam extracting means comprises an electrode disposed adjacent said injection nozzle.

6. An apparatus for forming a thin film as claimed in claim 3, further comprising:
- shielding means disposed in said internal vessel surrounding said filament and said electrode for shielding the electron beams directed from said filament toward said electrode.

7. An apparatus for forming a thin film as claimed in claim 3, further comprising means for controlling the kinetic energy of said reactive gas injected from said injection nozzle toward said substrate.

8. An apparatus for forming a thin film as claimed in claim 7, wherein said means for controlling the kinetic energy of said reactive gases comprises means for applying a variable electric field to said reactive gases.

9. An apparatus for forming a thin film as claimed in claim 1, further comprising a flow regulating valve connecting said pressurized gas source and said injection nozzle for controlling the flow rate of the gas supplied from said pressurized gas source to said injection nozzle.

10. An apparatus for forming a thin film comprising:
- a vacuum chamber;
- a vapor generating source disposed in said chamber for generating vapors of a material to be deposited on a substrate and clusters from a part of the vapors generated;
- ionization means for ionizing the vapors and the clusters which are generated by said vapor generating source;
- a first acceleration electrode for accelerating the ionized vapors and clusters to collide with said substrate;
- an internal vessel disposed in said chamber;
- a gas injection nozzle disposed in said internal vessel for injecting a reactive gas toward said substrate;
- electron beam emitting means disposed around a path of the injected reactive gas;
- an electron beam extraction electrode for drawing electrons out from said electron beam emitting means; and
- a second acceleration electrode disposed on an opening provided on a wall of said internal vessel for accelerating the reactive gas.

11. An apparatus for forming a thin film as claimed in claim 10, wherein both said electron beam emitting means and said electron beam extraction electrode are biased positively in respect to said second acceleration electrode.

12. An apparatus for forming a thin film as claimed in claim 10 further comprising an electron field shielding means disposed in said internal vessel surrounding both said electron beam emitting means and said electron beam extraction electrode for shielding the electric fields of said electron beam emitting means and said electron beam extracting electrode.

13. An apparatus for forming a thin film as claimed in claim 12, wherein the potential of said electrical field shielding means is identical to that of said electron beam emitting means.

14. An apparatus for forming a thin film as claimed in claim 12 wherein said electrical field shielding means is biased to a negative potential in respect to said electron beam emitting means.

* * * * *